United States Patent
Yoon et al.

(10) Patent No.: US 6,838,223 B2
(45) Date of Patent: Jan. 4, 2005

(54) COMPOSITIONS FOR ANTI-REFLECTIVE LIGHT ABSORBING LAYER AND METHOD FOR FORMING PATTERNS IN SEMICONDUCTOR DEVICE USING THE SAME

(75) Inventors: Sang-woong Yoon, Seoul (KR); Hoe-sik Chung, Yongin (KR); Jin-a Ryu, Daegu (KR); Young-ho Kim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/364,406

(22) Filed: Feb. 12, 2003

(65) Prior Publication Data
US 2003/0162120 A1 Aug. 28, 2003

(30) Foreign Application Priority Data
Feb. 16, 2002 (KR) .......................................... 2002-8324

(51) Int. Cl.$^7$ ............................. G03F 7/023; G03F 7/30
(52) U.S. Cl. ...................... 430/190; 430/313; 430/326; 430/512; 430/514
(58) Field of Search ................................. 430/190, 313, 430/326, 510, 512, 514, 191, 192, 193

(56) References Cited
U.S. PATENT DOCUMENTS

| | | | | |
|---|---|---|---|---|
| 3,859,099 A | * | 1/1975 | Petropoulos et al. ....... | 430/190 |
| 5,229,245 A | * | 7/1993 | Lin et al. ..................... | 430/190 |
| 5,908,738 A | * | 6/1999 | Sato et al. .................. | 430/512 |
| 5,939,236 A | * | 8/1999 | Pavelchek et al. ........ | 430/273.1 |
| 6,110,653 A | * | 8/2000 | Holmes et al. ............. | 430/325 |
| 6,372,403 B1 | * | 4/2002 | Kurisaki et al. ............ | 430/191 |
| 6,451,503 B1 | * | 9/2002 | Thackeray et al. ....... | 430/271.1 |
| 2003/0194635 A1 | * | 10/2003 | Mulligan .................... | 430/190 |

* cited by examiner

Primary Examiner—John S. Chu
(74) Attorney, Agent, or Firm—Lee & Sterba, P.C.

(57) ABSTRACT

A composition for an anti-reflective layer capable of simultaneously being developed together with a photoresist layer after exposure of the photoresist layer in a photolithography process and a method for forming patterns in a semiconductor device using the composition, wherein the anti-reflective light absorbing layer composition includes a polymer having a (meth)acrylate repeating unit, a light-absorbing group of diazoquinones chemically bound to the (meth)acrylate repeating unit, a photoacid generator, a cross-linker which thermally cross-links the polymer and is decomposed from the polymer by an acid, and a catalyst for the cross-linking reaction of the polymer. The method for forming patterns in a semiconductor device involves forming an anti-reflective layer on a semiconductor substrate using the composition and simultaneously exposing the anti-reflective layer and a photoresist layer, thereby chemically transforming the anti-reflective layer so it is able to be developed. The anti-reflective layer and the photoresist layer are simultaneously developed.

30 Claims, 3 Drawing Sheets

COMPOSITIONS FOR ANTI-REFLECTIVE LIGHT ABSORBING LAYER AND METHOD FOR FORMING PATTERNS IN SEMICONDUCTOR DEVICE USING THE SAME

BACKGROUND OF THE INVENTION

1. Field of the Invention

The present invention relates to a light absorbing layer composition and a method for fabricating a semiconductor device using the composition. More particularly, the present invention relates to a composition for an anti-reflective light absorbing layer capable of preventing light reflection from a substrate during exposure in a photolithography process during the manufacture of an integrated circuit device and a method for forming patterns in a semiconductor device using the composition.

2. Description of the Related Art

With trends towards high-density semiconductor devices, a micro-process for forming ultrafine patterns, recently on submicron levels, in a photolithography process has been developed. In a lithography process, a photoresist layer is coated on a substrate and subjected to exposure and development processes to form a mask pattern. In general, the substrate has high-reflectivity material layers thereon. Accordingly, light passed through the photoresist layer is reflected by the substrate during exposure, especially when the substrate has a step, so that reflective notching, standing wave, critical dimension deviations of photoresist patterns may result. For this reason, a technique to use an anti-reflective coating capable of absorbing the wavelength of an exposure light source to prevent reflection from underlying layers has been suggested.

Anti-reflective coatings used in the manufacture of semiconductor devices are classified into two groups according to their materials, an inorganic anti-reflective coating and an organic anti-reflective coating. Unlike the inorganic reflective coating formed by chemical deposition, the organic reflective coating may be simply formed by spin coating, and thus its applications are increasing.

However, the organic reflective coating is similar to photoresist materials in its basic chemical structure and has a low etching selectivity with respect to a photoresist layer during dry etching. As a result, during etching to remove the organic anti-reflective coating, consumption of the photoresist layer is increased. Therefore, there is a need to increase the thickness of the photoresist layer when the organic reflective coating is introduced.

In general, smaller thickness of the photoresist layer for lithography results in higher resonance. Also, the lower the limit of resolution, the smaller the thickness of the photoresist layer for the purpose of preventing photoresist pattern collapsing. In view of this, the thickness of the photoresist layer for photolithography is limited by the incorporation of the organic anti-reflective layer.

SUMMARY OF THE INVENTION

To solve the problems described above, it is a feature of an embodiment of the present invention to provide a composition for an anti-reflective light absorbing layer suitable for use in forming patterns in an integrated circuit device by photolithography.

It is another feature of an embodiment of the present invention to provide a method for forming patterns in a semiconductor device using the anti-reflective light absorbing layer composition, in which a photoresist layer and the anti-reflective light absorbing layer are simultaneously developed after exposure of the photoresist layer, so that consumption of the photoresist layer during removal of the anti-reflective light absorbing layer is prevented.

According to a feature of the present invention, there is provided a composition for an anti-reflective light absorbing layer, the composition including a polymer having a (meth)acrylate repeating unit, a light-absorbing group of diazoquinones chemically bound to the (meth)acrylate repeating unit, a photoacid generator, a cross-linker which thermally cross-links the polymer and is decomposed from the polymer by an acid, and a catalyst for the cross-linking reaction of the polymer.

It is preferable that the polymer has a light-absorptive repeating unit of the formula below:

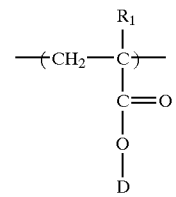

where $R_1$ is a hydrogen atom or a methyl group, and D is a light-absorbing group. The light-absorbing group may have a structural formula selected from the formulae below:

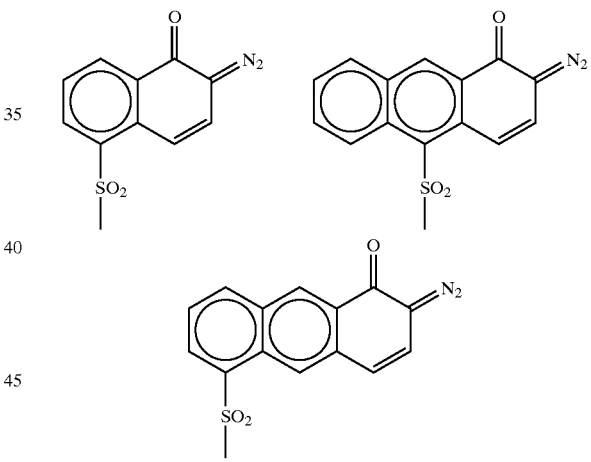

Preferably, the polymer comprises a light-absorptive repeating unit of the structural formula above and a non-light-absorptive repeating unit copolymerized with the light-absorptive repeating unit.

In the composition for an anti-reflective light absorbing layer according to the present invention, preferably, the light-absorbing group is contained in an amount of 10–60% by weight based on the total weight of the polymer.

In the polymer, preferably, the light-absorptive repeating unit and the non-light-absorptive repeating unit exist in a ratio of 10:90–90:10. The non-light-absorptive repeating unit of the polymer may include (meth)acrylic acid ester derivatives.

It is preferable that the photoacid generator is contained in an amount of 0.1–1.0% by weight based on the total weight of the polymer. The photoacid generator may include, for example, triarylsulfonium salts, diaryliodonium salts, sulfonates, or a mixture of these compounds.

It is preferable that the cross-linker is contained in an amount of 4–20% by weight based on the total weight of the polymer. The cross-linker may include, for example, melamines or cyanuric acids.

It is preferable that the catalyst is contained in an amount of 0.1–1.0% by weight based on the total weight of the polymer. The catalyst may include an acidic catalyst or an alkaline catalyst. More preferably, the catalyst comprises a primary amine, a secondary amine, or a tertiary amine.

According to another feature of the present invention, there is provided a method for forming patterns in a semiconductor device, the method including forming an anti-reflective layer on a semiconductor substrate using a light absorbing layer composition including a polymer having a light-absorptive repeating unit bound with a light-absorbing group of diazoquinones, a photoacid generator, and a cross-linker, forming a photoresist layer on the anti-reflective layer, simultaneously exposing the photoresist layer and the anti-reflective layer through a photomask, forming a photoresist layer pattern and an anti-reflective layer pattern through which the semiconductor substrate is exposed, by simultaneously developing the exposed photoresist layer and anti-reflective layer, and forming patterns on the semiconductor substrate by using the photoresist layer pattern as an etch mask.

Preferably, forming the anti-reflective layer includes coating the light absorbing layer composition on the semiconductor substrate and baking the coated light absorbing layer composition to induce the cross-linking of the polymer in the anti-reflective layer. In this case, coating the light absorbing layer composition may be performed by spin coating. Preferably, baking the coated light absorbing layer composition is performed at a temperature of 70–200° C.

The anti-reflective light absorbing layer composition according to the present invention is advantageous when used to form an anti-reflective layer that is required to form patterns in a semiconductor device by photolithography. The anti-reflective layer formed of the composition according to the present invention and a resist layer are simultaneously developed after exposure of the photoresist layer, so that a process of removing the anti-reflective layer by etching is unnecessary. As a result, consumption of the photoresist layer may be effectively prevented, and thus there is no need to increase the thickness of the photoresist layer.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE INVENTION

A composition for an anti-reflective light absorbing layer according to an embodiment of the present invention basically comprises in its structure a polymer having a predetermined light-absorptive repeating unit. A light-absorbing group is chemically bound to a side chain of the light-absorptive repeating unit of the polymer. The anti-reflective light absorbing layer composition according to the present invention comprises a photoacid generator and a cross-linker. The photoacid generator generates acid by using light during exposure to decompose the cross-linking of the polymer so that the polymer may be developed after the exposure. The cross-linker thermally cross-links the polymer and may be coupled to a side chain of the polymer to be decomposed from the cross-linked polymer by an acid. A catalyst is used to accelerate the cross-linking reaction of the polymer by the cross-linker.

Figure 1:
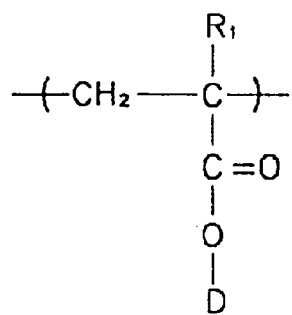
FIG. 1 shows a structural formula of a light-absorptive repeating unit of a polymer contained in a composition for an anti-reflective light absorbing layer according to a preferred embodiment of the present invention.

FIG. 1 shows an example of a structure of a light-absorptive repeating unit of a polymer contained in an anti-reflective light absorbing layer composition according to the present invention. In FIG. 1, $R_1$ is a hydrogen atom or a methyl group, and D is a diazoquinone-based light-absorbing group. For example, the light-absorbing group may have a structure selected from Formula 1 below:

Formula 1

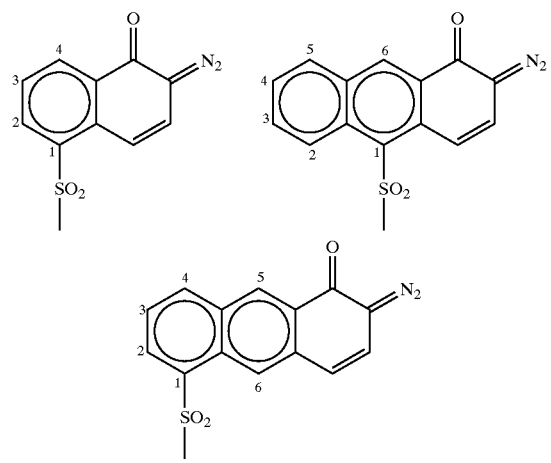

The light-absorbing group which the composition according to the present invention contains is a diazoquinone-based aromatic compound with a —$SO_2$ group coupled to a side chain of the polymer at any of positions 1 through 6.

To form the light-absorptive repeating unit having the structure shown in FIG. 1, a monomer is synthesized through the reaction illustrated in the following Reaction Scheme 1.

Reaction Scheme 1

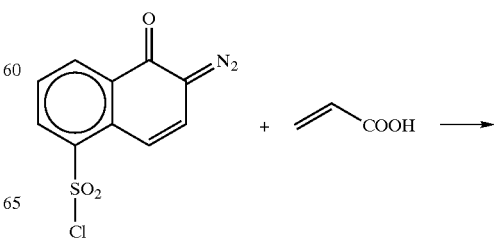

-continued

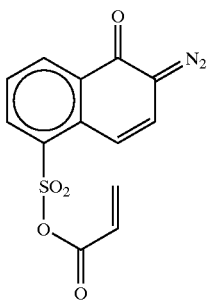

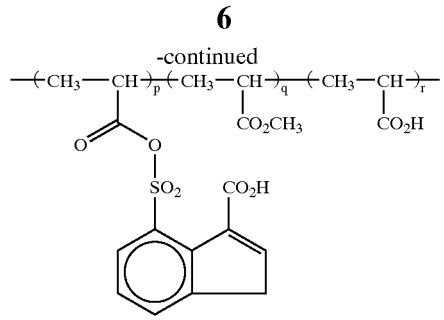

EXPOSED PORTION where X is a cross-linker.

The polymer contained in the composition according to the present invention may have a copolymer structure of a light-absorptive (meth)acrylate repeating unit of a formula as shown in FIG. 1 and a non-light-absorptive repeating unit. A typical example of the polymer having the copolymeric structure of the light-absorptive repeating unit and the non-light-absorptive repeating unit is shown in Formula 2 below.

Formula 2

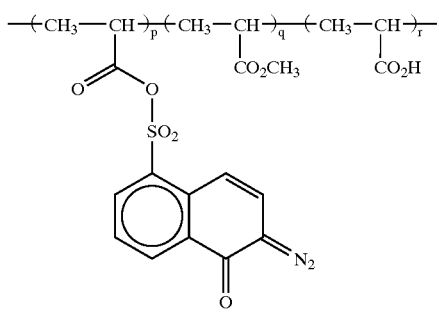

As shown in Formula 2 above, it is preferable that the non-light-absorptive repeating unit is a (meth)acrylic acid ester derivative.

The composition according to the present invention containing the polymer of Formula 2 above undergoes structural changes upon exposure in a non-exposed portion and exposed portion of the polymer, as shown in Formula 3 below:

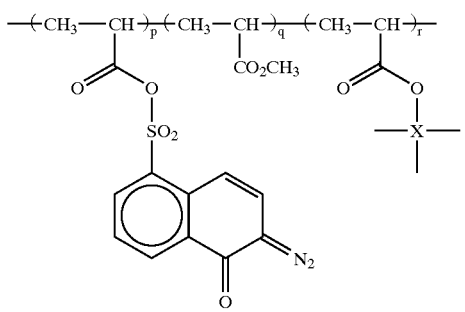

NON-EXPOSED PORTION

As shown in Formula 3 above, the composition according to the present invention is transformed after the exposure into a developable structure.

In the anti-reflective light absorbing layer composition according to the present invention, the light-absorptive repeating unit and the non-light-absorptive repeating unit of the polymer exist in a ratio of about 10:90–90:10. For example, in the polymer of Formula 2 above, a portion of the light-absorptive repeating unit (p) to other repeating units (q+r), that is, $p/(q+r)$, is in a range of about 0.1–0.9.

In the anti-reflective light absorbing layer composition according to the present invention, the amount of light-absorbing group D included is about 10–60% by weight of the total weight of the polymer.

In the anti-reflective light absorbing layer composition according to the present invention, the amount of photoacid generator included is about 0.1–1.0% by weight of the total weight of the polymer. Suitable photoacid generators for the composition according to the present invention include triarylsulfonium salts, diaryliodonium salts, sulfonates, or a mixture of these compounds.

The amount of cross-linker contained is about 4–20% by weight of the total weight of the polymer. Suitable cross-linkers for the composition according to the present invention include melamines or cyanuric acids.

An acidic catalyst or an alkaline catalyst may be used as the catalyst used to accelerate the cross-linking reaction of the polymer, but the alkaline catalyst is preferred. For example, a primary amine, a secondary amine, or a tertiary amine may be used as the catalyst. The amount of catalyst included is about 0.1–1.0% by weight of the total weight of the polymer.

A method for forming patterns in a semiconductor device according to the present invention will be described below in greater detail with reference to the following embodiments. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 2 through 7 depict sectional views of a semiconductor device illustrating each step of a preferred embodiment of the method for forming patterns in a semiconductor device according to a preferred embodiment of the present invention.

Figure 2:
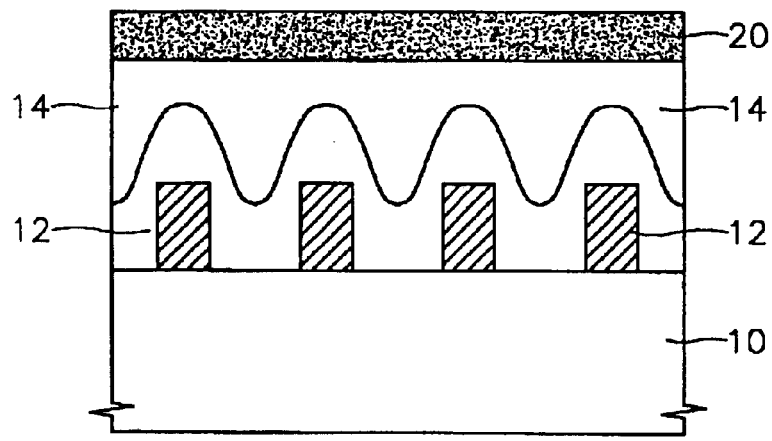
FIGS. 2 through 7 depict sectional views of a semiconductor device illustrating each step of a method for forming patterns in a semiconductor device according to a preferred embodiment of the present invention.

Referring to FIG. 2, an anti-reflective layer 20 is formed on an insulating layer 14 covering a lower structure 12 formed on a semiconductor substrate 10. The anti-reflective layer 20 is formed of the anti-reflective light absorbing layer composition according to the present invention as described above. In other words, on the insulating layer 14 formed on the semiconductor substrate 10, the composition according to the present invention, which comprises a polymer having a light-absorptive repeating unit bound with a diazoquinone-based light-absorbing group, a photoacid generator, a cross-linker, and a catalyst, is coated by spin coating. Next, the coated composition is baked at a temperature of about 70–200° C. to induce cross-linking of the polymer in the composition, thereby forming the anti-reflective layer 20.

Figure 3:
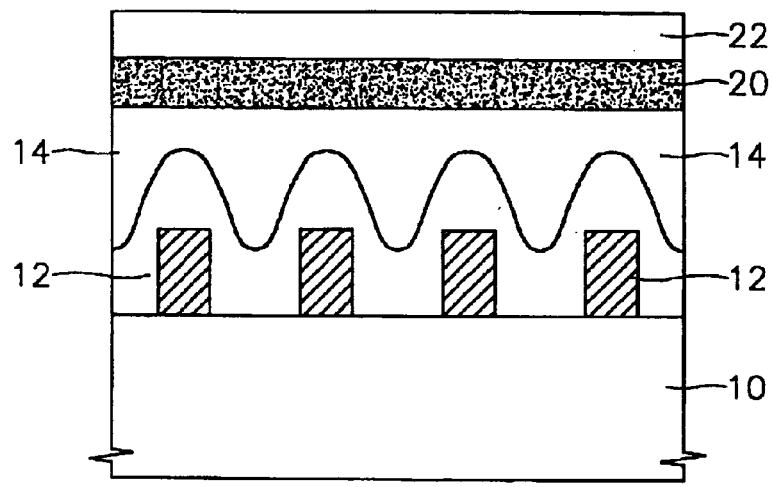

Next, a photoresist layer 22 is formed on the anti-reflective layer 20, as shown in FIG. 3.

Figure 4:
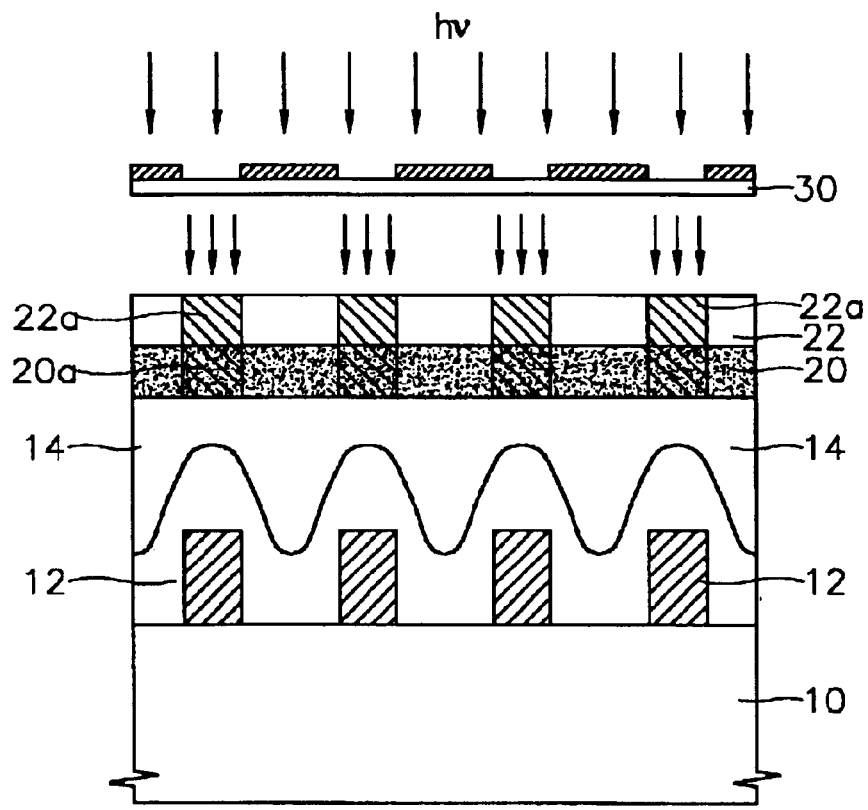

The photoresist layer 22 and the anti-reflective layer 20 are simultaneously exposed through a photomask 30, as shown in FIG. 4. As a result, exposed portions 20a and 22a are formed in the anti-reflective layer 20 and the photoresist layer 22, respectively. In the exposed portion 20a of the anti-reflective layer 20, the polymeric structure is transformed to be able to be developed, as shown in formula (3) above, due to the action of acid generated by a photoacid generator during the exposure.

Figure 5:
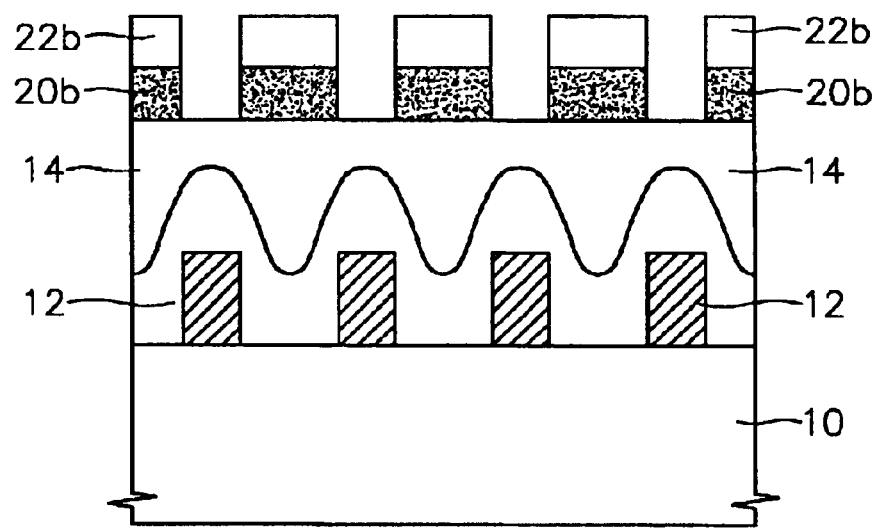

Next, as shown in FIG. 5, the exposed photoresist layer 22 and anti-reflective layer 20 are simultaneously developed to form an anti-reflective layer pattern 20b and a photoresist layer pattern 22b through which the insulating layer 14 on the semiconductor substrate 10 is exposed. Here, as described above, the exposed portion 20a of the anti-reflective layer 20 may be easily removed through development using a common developer solution.

Figure 6:
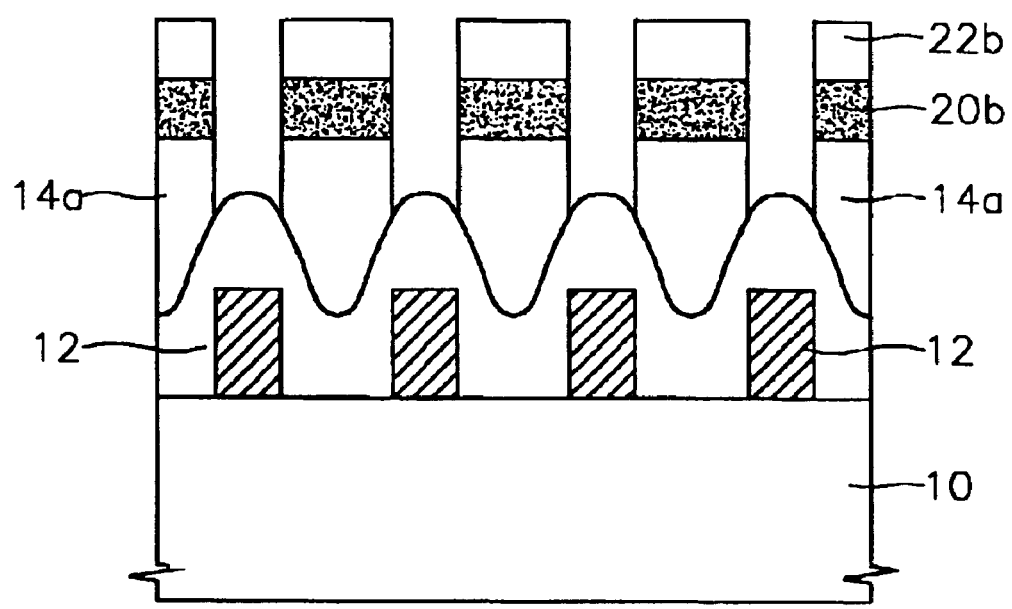

Next, as shown in FIG. 6, the insulating layer 14 is etched using the photoresist layer pattern 22b as an etch mask, to form an insulating layer pattern 14a.

Figure 7:
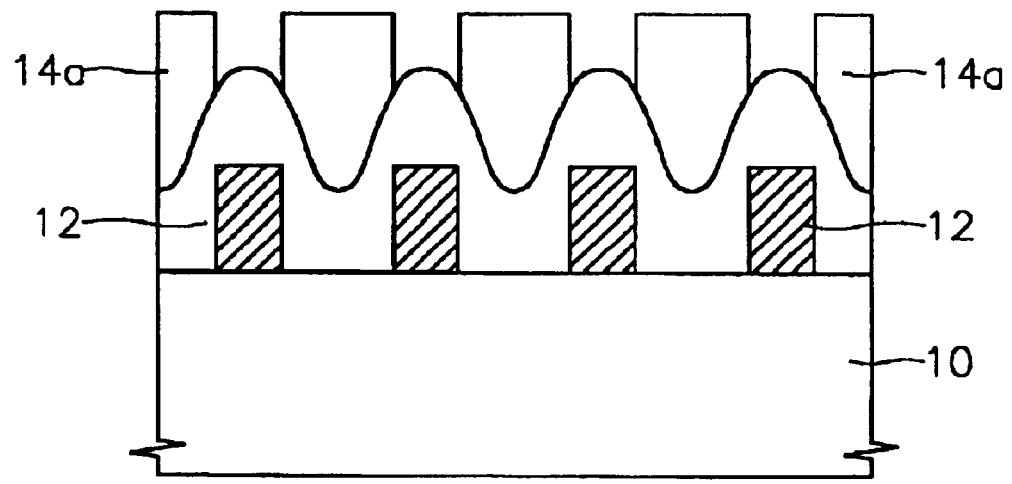

Next, as shown in FIG. 7, the photoresist layer pattern 22b and the anti-reflective layer pattern 20b are removed.

As described above, in forming the insulating layer pattern 14a on the semiconductor substrate 10, the anti-reflective layer 20 formed of the composition according to the present invention and the photoresist layer 22 may be simultaneously developed after the exposure of the photoresist layer 22. Therefore, an etching process, prior to the patterning of the insulating layer 14, for removing a portion of the anti-reflective layer 20 may be omitted, thereby preventing the photoresist layer 22 from being removed. Accordingly, there is no need to increase the thickness of the photoresist layer 22 to compensate for a portion of the photoresist layer 22 that could be removed by etching.

As described above, an anti-reflective light absorbing layer composition according to the present invention comprises a polymer having a light-absorptive repeating unit, a light-absorbing group of diazoquinones chemically bound to the light-absorptive repeating unit, a photoacid generator, a cross-linker, and a catalyst for the cross-linking reaction of the polymer. Therefore, when the anti-reflective light absorbing layer composition according to the present invention is applied to form an anti-reflective layer for use in forming a semiconductor device patterned by photolithography, the anti-reflective layer and a photoresist layer may be simultaneously developed after exposure of the photoresist layer. Accordingly, it is unnecessary to remove the anti-reflective layer by additional etching. Therefore, the photoresist layer is protected from being removed by etching, thereby eliminating the need to increase the thickness of the photoresist layer. As a result, resolution in the photolithography process for forming patterns is enhanced, and the overall process may be simplified. Therefore, a method for forming a pattern in a semiconductor device using the anti-reflective light absorbing layer composition according to the present invention may be advantageously applied in the manufacture of highly integrated semiconductor circuit devices.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A composition for an anti-reflective light absorbing layer, the composition comprising:

a polymer having a (meth)acrylate repeating unit;

a light-absorbing group of diazoquinones chemically bound to the (meth)acrylate repeating unit;

a photoacid generator;

a cross-linker which thermally cross-links the polymer and is decomposed from the polymer by an acid; and a catalyst for the cross-linking reaction of the polymer.

2. The composition as claimed in claim 1, wherein the polymer has a light-absorptive repeating unit of the following formula:

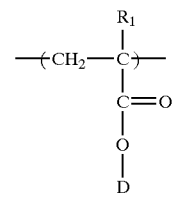

where $R_1$ is a hydrogen atom or a methyl group, and D is the light-absorbing group.

3. The composition as claimed in claim 1, wherein the light-absorbing group has a structural formula selected from the following formulae:

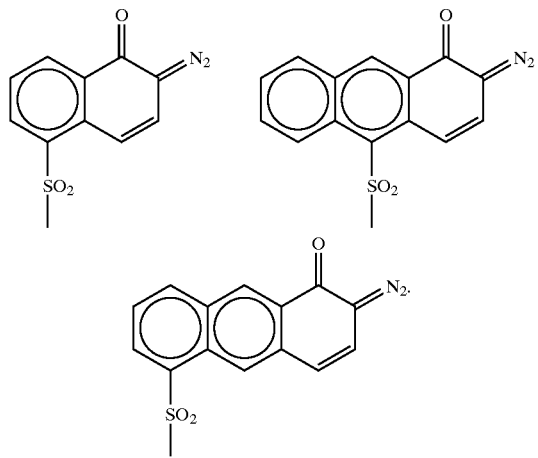

4. The composition as claimed in claim 1, wherein the polymer comprises:

a light-absorptive repeating unit of the formula below

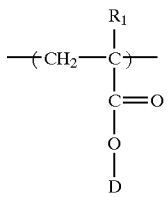

where $R_1$ is hydrogen atom or a methyl group, and D is the light-absorbing group; and a non-light-absorptive repeating unit copolymerized with the light-absorptive repeating unit.

5. The composition as claimed in claim 4, wherein the light-absorbing group is contained in an amount of about 10–60% by weight based on the total weight of the polymer.

6. The composition as claimed in claim 4, wherein in the polymer the light-absorptive repeating unit and the non-light-absorptive repeating unit exist in a ratio of about 10:90–90:10.

7. The composition as claimed in claim 4, wherein the non-light-absorptive repeating unit comprises (meth)acrylic acid ester derivatives.

8. The composition as claimed in claim 1, wherein the photoacid generator is contained in an amount of about 0.1–1.0% by weight based on the total weight of the polymer.

9. The composition as claimed in claim 1, wherein the photoacid generator comprises triarylsulfonium salts, diaryliodonium salts, sulfonates, or a mixture of these compounds.

10. The composition as claimed in claim 1, wherein the cross-linker is contained in an amount of about 4–20% by weight based on the total weight of the polymer.

11. The composition as claimed in claim 1, wherein the cross-linker comprises melamines or cyanuric acids.

12. The composition as claimed in claim 1, wherein the catalyst is contained in an amount of about 0.1–1.0% by weight based on the total weight of the polymer.

13. The composition as claimed in claim 1, wherein the catalyst comprises an acidic catalyst or an alkaline catalyst.

14. The composition as claimed in claim 13, wherein the catalyst comprises a primary amine, a secondary amine, or a tertiary amine.

15. A method for forming patterns in a semiconductor device, the method comprising:

forming an anti-reflective layer on a semiconductor substrate using a light absorbing layer composition including a polymer having a light-absorptive repeating unit bound with a light-absorbing group of diazoquinones, a photoacid generator, and a cross-linker;

forming a photoresist layer on the anti-reflective layer;

simultaneously exposing the photoresist layer and the anti-reflective layer through a photomask;

forming a photoresist layer pattern and an anti-reflective layer pattern through which the semiconductor substrate is exposed, by simultaneously developing the exposed photoresist layer and anti-reflective layer; and forming patterns on the semiconductor substrate by using the photoresist layer pattern as an etch mask.

16. The method as claimed in claim 15, wherein forming the anti-reflective layer comprises:

coating the light absorbing layer composition on the semiconductor substrate; and baking the coated light absorbing layer composition to induce the cross-linking of the polymer in the anti-reflective layer.

17. The method as claimed in claim 16, wherein coating the light absorbing layer composition is performed by spin coating.

18. The method as claimed in claim 16, wherein baking the coated light absorbing layer composition is performed at a temperature of about 70–200° C.

19. The method as claimed in claim 15, wherein the polymer has a light-absorptive repeating unit of the formula below:

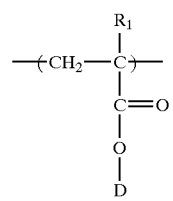

where $R_1$ is a hydrogen atom or a methyl group, and D is a light-absorbing group.

20. The method as claimed in claim 15, wherein the light-absorbing group has a structural formula selected from the formulae below:

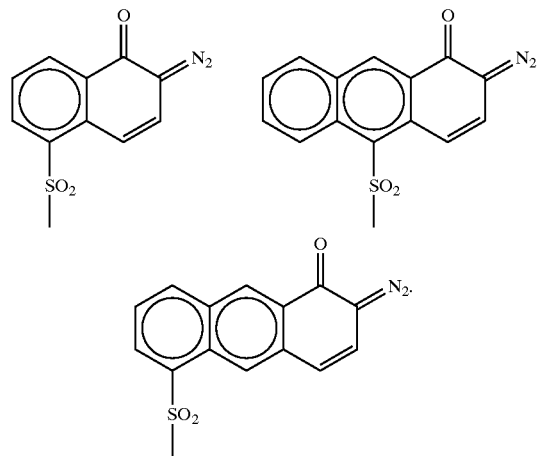

21. The method as claimed in claim 15, wherein the polymer comprises:

a light-absorptive repeating unit of the following formula,

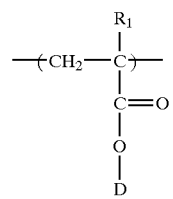

where $R_1$ is hydrogen atom or a methyl group, and D is the light-absorbing group; and a non-light-absorptive repeating unit copolymerized with the light-absorptive repeating unit.

22. The method as claimed in claim 21, wherein the light-absorbing group is contained in an amount of about 10–60% by weight based on the total weight of the polymer.

23. The method as claimed in claim 21, wherein in the polymer the light-absorptive repeating unit and the non-light-absorptive repeating unit exist in a ratio of about 10:90–90:10.

24. The method as claimed in claim 21, wherein the non-light-absorptive repeating unit comprises (meth)acrylic acid ester derivatives.

25. The method as claimed in claim 15, wherein the photoacid generator is contained in an amount of about 0.1–1.0% by weight based on the total weight of the polymer.

26. The method as claimed in claim 15, wherein the cross-linker is contained in an amount of about 4–20% by weight based on the total weight of the polymer.

27. The method as claimed in claim 15, wherein the cross-linker comprises melamines or cyanuric acids.

28. The method as claimed in claim 16, wherein the light absorbing layer composition further comprises a catalyst for the cross-linking reaction of the polymer.

29. The method as claimed in claim 28, wherein the catalyst is contained in an amount of about 0.1–1.0% by weight based on the total weight of the polymer.

30. The method as claimed in claim 28, wherein the catalyst comprises a primary amine, a secondary amine, or a tertiary amine.

* * * * *